United States Patent [19]

Bird

[11] Patent Number: 5,784,476
[45] Date of Patent: Jul. 21, 1998

[54] AUDIO SIGNAL REPRODUCTION APPARATUS

[75] Inventor: Neil C. Bird, Horley, England

[73] Assignee: U.S. Philips Corporation, New York, N.Y.

[21] Appl. No.: 934,302

[22] Filed: Sep. 19, 1997

Related U.S. Application Data

[63] Continuation of Ser. No. 673,836, Jun. 27, 1996, abandoned.

[30] Foreign Application Priority Data

Jun. 30, 1995 [GB] United Kingdom ............... 9513419

[51] Int. Cl.$^6$ .................................................. H03G 3/00
[52] U.S. Cl. ........................... 381/107; 381/104; 381/106
[58] Field of Search ................................. 381/102, 104, 381/106–109; 333/14

[56] References Cited

U.S. PATENT DOCUMENTS

| | | | |
|---|---|---|---|
| 4,297,527 | 10/1981 | Pate . | |
| 4,747,065 | 5/1988 | West . | |
| 4,926,485 | 5/1990 | Yamashita | 381/107 |
| 5,016,205 | 5/1991 | Shumway . | |
| 5,018,205 | 5/1991 | Takagi et al. | 381/86 |
| 5,255,325 | 10/1993 | Ishimitsu | 381/107 |
| 5,396,562 | 3/1995 | Ishimitsu et al. | 381/107 |
| 5,422,602 | 6/1995 | Werrbach | 381/107 |
| 5,533,136 | 7/1996 | Smith | 381/107 |
| 5,577,126 | 11/1996 | Klippel | 381/107 |
| 5,633,940 | 5/1997 | Wassink | 381/102 |
| 5,640,460 | 6/1997 | May et al. | 381/104 |
| 5,666,426 | 9/1997 | Helms | 381/104 |

FOREIGN PATENT DOCUMENTS

0654954A1  11/1994  European Pat. Off. .

*Primary Examiner*—Curtis Kuntz
*Assistant Examiner*—Xu Mei
*Attorney, Agent, or Firm*—Edward W. Goodman

[57] ABSTRACT

Audio signal reproduction apparatus, for example, an in-car entertainment system, includes a number of audio signal sources (I—I to I-N) which are selected by means of a selector (2) and fed to an AGC circuit (4) before being applied to an amplifier (6) and loudspeaker (7). The AGC circuit (4) includes an amplitude analyzer (42) and a low-pass filter (43) to produce an output signal (44) which controls the gain of an amplifier (41). The arrangement is such that the AGC circuit only causes a gain change when the audio signal lies outside a predetermined amplitude band for a given minimum time period. Thus only long "too loud" or "too soft" passages cause a gain change and transients pass through the arrangement without causing a gain change.

6 Claims, 3 Drawing Sheets

1

AUDIO SIGNAL REPRODUCTION APPARATUS

This is a continuation of application Ser. No. 08/673,836, filed Jun. 27, 1996, abandoned.

BACKGROUND OF THE INVENTION

1. Field of the Invention

The invention relates to audio signal reproduction apparatus.

Modern high quality sound sources, such as compact disc (CD), mini disc (MD), digital compact cassette (DCC), digital audio tape (DAT), and the soon to be introduced digital audio broadcasting (DAB), are of high quality and have a large dynamic range. In a quiet listening environment, a large dynamic range is desirable as it will enable the realistic reproduction of music such as an orchestral symphony which has both very loud and very quiet passages. In noisy environments, however, the background noise causes a major problem in that for quiet passages, the volume of the music has to be turned up so that they are audible. This results in the loud passages being little short of ear splitting. Conversely, if the volume is set so that the loud passages are reproduced at a reasonable level the quiet passages of the music are inaudible. An example of such a noisy background is in a motor vehicle, where there are a number of background noise sources which can be significant, such as tire noise and wind noise, especially when travelling at relatively high speeds. Thus, the driver may have to resort to frequent manual volume changes during the course of a piece of music. This is not only annoying for the driver and reduces his listening pleasure but it also distracts the driver's attention from the road, this has obvious safety considerations, particularly while driving at high speed.

2. Description of the Related Art

One solution to this problem is to apply straight forward compression to the signal prior to amplification. This can raise the level of the quiet passages and reduce that of the loud passages. This will remove, or at least substantially reduce, the requirement to frequently adjust the volume control but will remove one of the advantages of the modern high quality sound systems, namely the large dynamic range.

SUMMARY OF THE INVENTION

It is an object of the invention to enable the provision of audio reproduction apparatus in which the necessity for frequently adjusting the gain (volume control) while listening to a sound source which has a large dynamic range is reduced.

The invention provides audio signal reproduction apparatus comprising input means for receiving an input audio signal, amplifying means, monitoring means for monitoring the amplitude of the input audio signal; and gain control means for controlling the gain of the amplifying means in response to the amplitude of the input audio signal; wherein the monitoring means is arranged to determine whether, at any given time, the input audio signal amplitude exceeds a first preset value, is below a second preset value, or lies between the first and second preset values, and the gain control means is responsive to the monitoring means to cause the gain of the amplifier means to be set to a first value if the input audio signal exceeds the first preset value for at least a given time period, to be set to a second value if the input audio signal is between the two preset values for at least the given time period, and to be set to a third value if the audio input signal amplitude is below the second preset value for at least a given time period.

The invention enables the provision of a self adjusting volume control system which has a much lower effect on the perceived dynamic range of the reproduced sound than other possible approaches. It has special application to in-car entertainment products as this is a particularly noisy environment. It is, however, by no means confined to use with in-car entertainment systems as it would be equally appropriate to use the invention with any audio system which may be listened to in a noisy environment. The invention is based on the realization that the perceived dynamic range of a reproduced musical passage is significantly affected by the range of the transient signals and that the longer term loud and quiet passages do not need to be as widely spaced in amplitude terms once the transition from one to the other has passed.

When the input audio signal is in digital form, the monitoring means may comprise a digital comparator providing a first output control signal when the input audio signal amplitude is above the first preset value, a second output control signal when the input audio signal amplitude is between the first and second preset values, and a third output control signal when the input audio signal amplitude is below the second preset value.

The apparatus may comprise a multiplier circuit having a first input to which the input audio signal is applied and a second input to which the first, second, and third output control signals are applied, the output of the multiplier being coupled to audio output means.

The given period may be between one and five seconds. The actual time chosen will depend on user preferences and needs to be long enough to ensure that short loud bursts pass through the apparatus unattenuated, but that "too loud" or "too quiet" passages do not last for a length of time which disturbs the listener sufficiently for there to be a temptation to manually adjust the volume.

For a quiet passage which persists for at least the given time period, the gain may be set to the third value at the start of the quiet passage. In this way, it can be arranged that the listener does not miss the start of a quiet passage, or at least that the length of the passage which might be inaudible may be less than the given time. Thus a shorter, but non-zero, interval may be applied before increasing the gain to ensure that the full transient effect is preserved as an alternative to increasing the gain as soon as the "too-soft" threshold is reached.

More than two preset levels and a corresponding number of gain factors may be provided. In this way, a smaller gain reduction (or increased factors may be applied when the input signal is marginally above (or below) the "too loud" (or "too-soft") thresholds than when it is greatly above (or below) those thresholds.

The invention further provides an in-car entertainment system including such audio signal reproduction apparatus. This is a prime application of the invention and one in which it can be particularly advantageously used to overcome the safety problems associated with frequent manual adjustments of the volume by a driver travelling at high speed when the background noise produced by the car is particularly intrusive.

BRIEF DESCRIPTION OF DRAWINGS

The foregoing and other features and advantages of the invention will become apparent from the following description, by way of example, of embodiments of the invention with reference to the accompanying drawings, in which.

DESCRIPTION OF THE PREFERRED EMBODIMENTS

Figure 1:
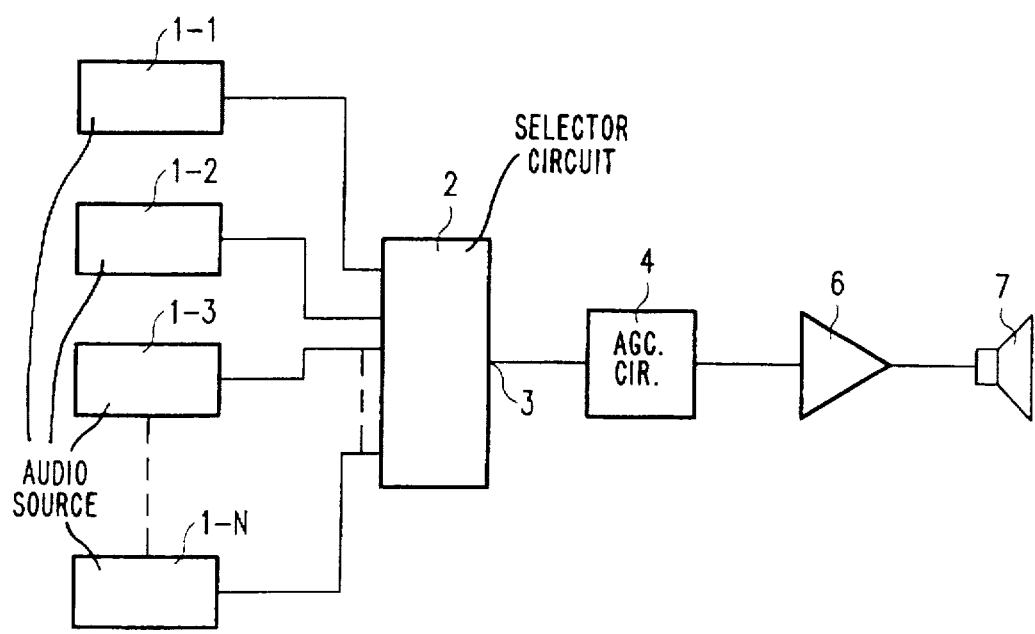
FIG. 1 shows, in block schematic form, an embodiment of audio signal reproduction apparatus according to the invention.

As shown in FIG. 1, the audio reproduction apparatus comprises a number of audio sources 1—1 to 1-N. These sources may for example, be a radio tuner, a DCC player, a DAT player, or a CD player. The outputs from these sources are fed to a selector circuit 2 which enables the selection of one of these plurality of sources. An output 3 of the selector circuit 2 is fed to an automatic gain control circuit 4 whose output is fed to the input of an amplifier 6 which is an audio output amplifier whose output drives a loudspeaker 7.

Figure 2:
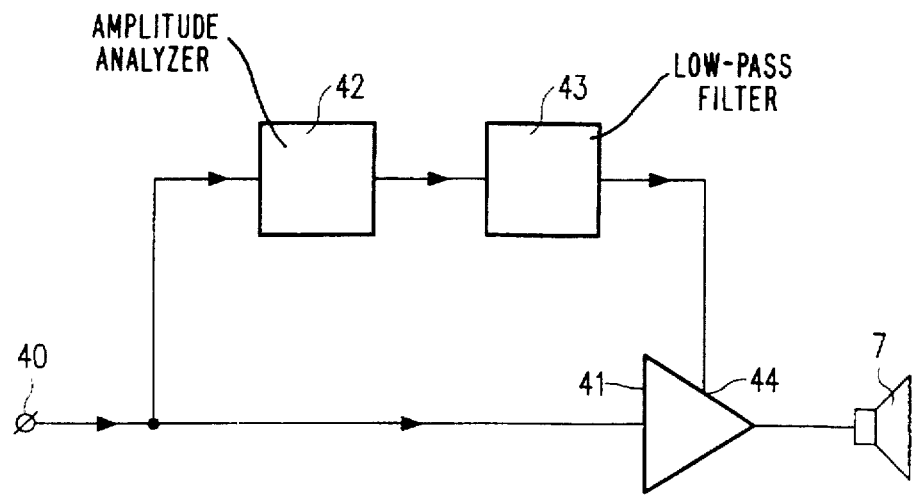
FIG. 2 shows an analog AGC circuit for use in the apparatus of FIG. 1.
Figure 3:
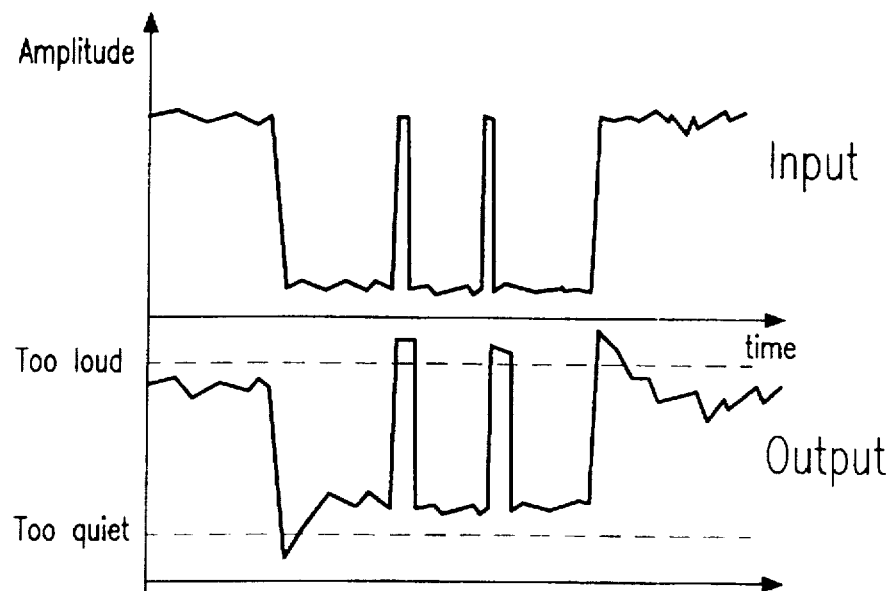
FIG. 3 shows an output audio signal produced by the arrangement of FIG. 1 corresponding to a typical audio input signal.

For an analog input signal, the automatic gain control circuit 4 and amplifier 6 could be implemented as shown in FIG. 2. As shown in FIG. 2, an input audio signal derived from the output 3 of the selector circuit 2 is applied to input 40 and is fed to the input of an amplifier 41 and to the input of an amplitude analyzer 42. The output of the amplitude analyzer 42 is fed, via a low pass filter 43, to a control input 44 of the amplifier 41. The amplitude analyzer 42 is arranged to detect whether the input audio signal level is above a first preset level, below a second preset level or, lies between the first and second preset levels. When the amplitude is above the first preset level it causes a control signal to be generated which is operative to reduce the gain of the amplifier 41. Conversely, when the input audio signal amplitude is below the second preset level, then the amplitude analyzer 42 causes a control signal to be generated which is operative to increase the gain of the amplifier 41. The low pass filter 43 is present to prevent the gain changes from taking place instantaneously. This non-instantaneous volume change will, of course, mean that the beginning of a quiet section after a loud passage, will be missed because the volume control will be at a setting determined by the immediately preceding passage that is either a low setting if the immediately preceding passage is a loud passage or at an intermediate setting if the immediately preceding passage was between the first and second preset values. This is illustrated in FIG. 3. In FIG. 3, the upper trace is the input signal to the automatic gain control arrangement at input 40 while the lower trace is the output produced at the output of the amplifier 41. The upper trace is a signal which is typical of that found in classical music and illustrates a loud passage followed by a quiet passage with short loud bursts. At the end, there is a loud passage. The lower trace shows the amplitude of the output of the amplifier 41 (equivalent to amplifier 6 in FIG. 1). At the beginning of the passage, the output is just below the too loud threshold which would have been determined by the normal volume control setting of the reproduction apparatus. When the quiet section starts the output volume drops below the too quiet threshold because of the action of the low pass filter. That is, there is a delay before the change in output of the amplitude analyzer 42 is applied to the control input of the amplifier 46, which is dependent on the time constant of the low pass filter 43. The start of the quiet passage is therefore lost in the background noise of the car. After a short delay the output reaches the required level, this delay being dependent on the characteristics of the low pass filter 43. Because of the action of the low pass filter, the two transients get through the system, since the short duration changes in the output of the amplitude analyzer 42 will not pass through the filter 43 to the control input of the amplifier 41. This is actually desirable since these transients are often an important part of the music and are mainly responsible for the perceived dynamic range of the music. In addition, short loud bursts are not as disturbing to the listener as a continuous loud passage. At the end of the quiet section, the output increases beyond the preset "too-loud" value for a short period before the reduction in gain operates, again due to the time constant of the low pass filter. There is of course a compromise to be made in selecting the time constant of the AGG circuit. If it is too short, the important transients will be attenuated, and if it is too long the start of long, loud or quiet passages will be outside the too loud and too-quiet thresholds, respectively, for periods which will be disturbing to the listener.

It is of course, entirely possible to have more than two threshold values and to have a corresponding number of gain multipliers. This can be achieved by means of a plurality of comparator circuits which will enable thresholds of various amplitudes to be determined.

Figure 4:
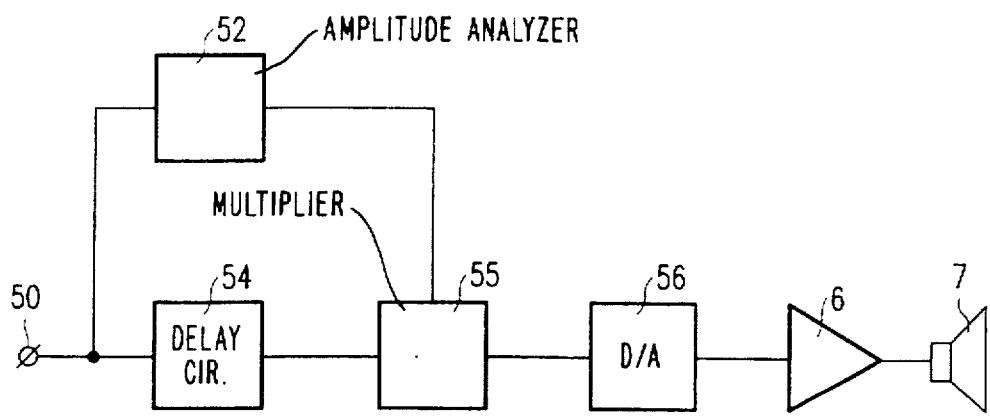
FIG. 4 shows in block schematic form a digital AGC circuit for use in the apparatus of FIG. 1.

FIG. 4 shows an alternative arrangement for an automatic gain control circuit for use when the input audio signal is in digital form. As shown in FIG. 4, the input 50, which receives a digital audio signal from the output 3 of the selector 2, is connected to a delay circuit 54 and also to the input of an amplitude analyzer 52. The output of the amplitude analyzer 52 is connected to a first input of a multiplier circuit 55, while the output of the delay circuit 54 is fed to a second input of the multiplier circuit 55. The output of the multiplier circuit 55 is fed to a digital to analog converter 56 whose output is connected to the amplifier 6 shown in FIG. 1.

In operation, the amplitude analyzer 52 is arranged to detect whether or not the input audio samples are above a first threshold value, below a second threshold value, or are between the two threshold values. The amplitude analyzer 52 also detects the time period for which these conditions apply. The delay circuit 54 is equivalent to the time constant of the low pass filter 43 and delays the input samples fed to the multiplier 55 for a period which corresponds with the time that the amplitude analyzer 52 takes to determine whether or not the input samples lie within the given ranges and for how long. Thus, in terms of the characteristics shown in FIG. 3, the output of the amplitude analyzer 52 will apply a first multiplying factor to the multiplier 55 during the first loud passage of the input signal. This multiplying factor will be less than one so that the output of the multiplier is an attenuated version of the input signal to ensure that it remains below the too-loud threshold. When the loud passage finishes and the soft passage starts, the amplitude analyzer 52 will detect that the input signal has fallen below the second threshold value. This will cause the multiplying factor applied to the multiplier 55 to be increased to above unity. Because of the action of the delay circuit 54, it is possible to prevent an undershoot of the too-quiet threshold since the gain of the multiplier 55 can effectively be changed at the instant that the crossing of the too-quiet threshold would take place. This is because of the action of the delay circuit 54 in delaying the input of the audio samples to the multiplier until after the gain of the multiplier has been determined by the amplitude analyzer 52. The amplitude analyzer 52 however does require that the thresholds are exceeded for a given period. Thus, although while the change from a continuous loud passage to a continuous quiet passage can be effected instantaneously on the transition, it is still possible to allow short bursts to pass through unchanged since the output of the amplitude analyzer 52 will not change unless the threshold is exceeded for a given period of time. It is, of course, possible to tailor the characteristic in any manner desired. That is, the length of time for which the threshold, either too-loud or too-soft, must be exceeded before a change in gain is indicated can be set to any value required. Also, any delay can be introduced after a transition so that for a transition to a too-quiet passage after a too-loud passage, the first portion of the quiet passage may be lost to emphasize the effect of the transient transition between the two passages.

It is of course, possible for the amplitude analyzer 52 to set more than two thresholds and to produce appropriate multiplying factors for the multiplier 55 depending on the amplitude ranges of the input signal applied.

Figure 5:
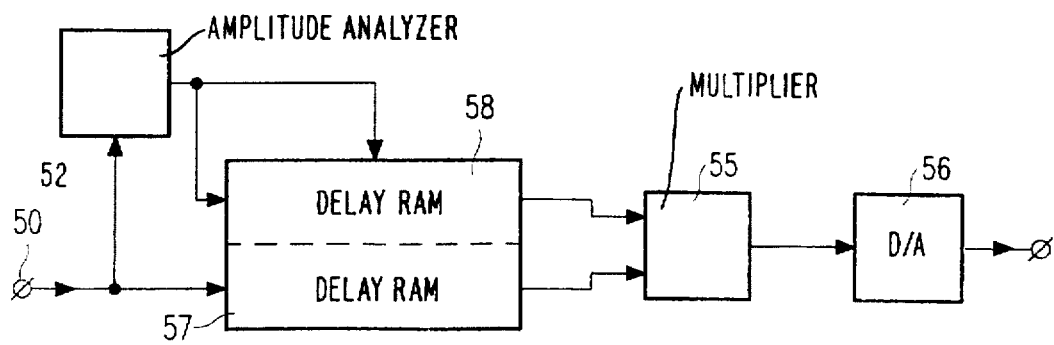
FIG. 5 shows, in greater detail, a first embodiment of the AGC circuit of FIG. 4.

One implementation of the digital version of the AGC circuit is shown in FIG. 5. Digital data from the output 3 of the selector 2 is fed to the input 50 from where it is fed to an input of the amplitude analyzer 52 and to a source data (that is audio samples) delay RAM 57. The output of the amplitude analyzer 52 is fed to a volume data (volume control setting) delay RAM 58. The output of the source data delay RAM 57 and volume data delay RAM 58 are fed to first and second inputs of the multiplier 55.

The operation of this arrangement is as follows:

Each location within the RAM stores one source (audio) sample in the source data delay RAM 57 and a volume data control byte that is calculated by the amplitude analyzer 52 in the volume data delay RAM 58. In order to be able to look back to measure the length of the calculated volume control changes, the amplitude analyzer 52 has direct access to data already in the delay RAM 58. At the output of the delay RAM, the delayed data and volume information are fed to the multiplier 55. The output of the multiplier 55 is fed to the digital-to-analog convertor 56 where it is converted into an analog signal for application to the input of the output amplifier 6.

The detailed operation of the circuit will be illustrated by considering the amplitude profile of a passage of music where the majority of the passage lies within the minimum and maximum levels but where the passage also includes a long loud section and a short transient loud section. In the amplitude profile shown in FIG. 6, the long loud section lasts for 7 samples and is followed by a short loud transient of 3 samples. In this example, the time threshold that distinguishes a long section from a transient is 4 samples. The first loud section should therefore be attenuated and the second should be allowed to pass through unchanged. Note the section lengths are only specified for illustration and are not in fact typical. Normally, the time threshold would be of the order of a few seconds, say 2 seconds which with a 44 kilo-sample data rate would give a threshold approaching 100 kilo-samples. As data is sent from the source, the amplitude analyzer 52 measures the signal amplitude and calculates whether a volume control change would be required for that particular sample and what the new volume control position, that is, what multiplying factor would be required. The multiplying factor, is quantized, for example, 0.5, 1.0 and 1.5, where the mid value would give the average listening volume control position. The source data for this sample is written into the first location of the volume date delay RAM 58. For the purpose of this part of the description, it is assumed that a delay is provided by a RAM configured to operate like a shift register. The detailed implementation using a RAM will be considered later.

Figure 6:
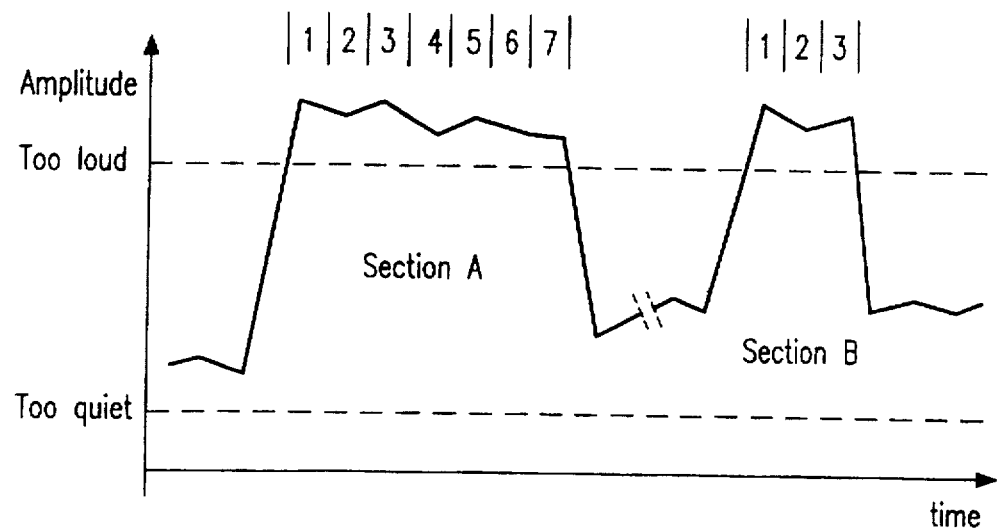
FIG. 6 illustrates the operation of a digital AGC circuit on a typical sound package.

In the musical passage shown in FIG. 6 the amplitude analyzer 52 takes no further action for the first series of samples when the amplitude is within the preset limits and the samples are written into the shift register. When the first sample of section A arrives, the amplitude analyzer 52 detects that the volume control must be turned down to keep the music output volume within the preset levels. The amplitude analyzer 52 calculates what the volume control position should be for this sample and writes that information to the volume data delay RAM 58. Since there has been a change in the volume control level, the amplitude analyzer 52 resets an internal counter. This counter will be used to measure the length of the loud section. For the subsequent samples of section A, the amplitude analyzer calculates that no change in volume control position is, required. That is the volume control position for the duration of section A is the same as that required for the first sample in section A. For each sample in section A, the counter is incremented. When the end of section A is reached, the amplitude analyzer 52 calculates that the volume control position for the first sample after section A can be the mid point volume control position. Since there has been a change in volume control position, the amplitude analyzer 52 uses the contents of the internal counter to calculate the length of the loud section that is just finished. If the length of the loud section is longer than the threshold time, the amplitude analyzer 52 takes no further action. This is the case for section A since it is 7 samples long and the threshold is set to 4 samples.

The same process is repeated for section B, this time however, at the end of the section, the internal counter, which monitors the length of the current loud section, indicates that the length of section B is less than the time threshold. The amplitude analyzer 52 therefore identifies section B as a short transient for which the volume control position should not be changed. The amplitude analyzer 52 uses the counter value to calculate where the first sample of section B has moved to inside the shift register and deletes the volume control change data from that sample. Clearly, it is not necessary to wait until the end of a long loud or soft passage to determine whether it is longer that the predetermined time as the counter itself will indicated that this time has elapsed. Thus, it is only necessary to determine that any level or soft passage is shorter than the predetermined time and inhibit any volume change in that particular case.

At the output of the shift register delay, the following happens:

The first sample of section A arrives at the output of the shift register together with a new setting for the volume control. The volume control data is fed to one input of the multiplier and stored. The source data from this and subsequent samples is multiplied by the stored volume control byte, or perhaps from a value derived from it. The audio samples of Section A are multiplied by the multiplying factor set by the amplitude analyzer 52, that is, a factor less than one, to reduce their amplitudes. The output of the multiplier 55 is fed to the DAC 46 with its new reduced volume since the multiplying factor was less than 1. At the end of section A, a mid-point volume control byte is received and this is stored in the multiplier 55. The samples between the end of section A and the start of section B are therefore reproduced with the volume control at the mid-point setting. When section B arrives at the output of the delay, there is no volume control change byte so that the transient passes through unchanged. Section B is therefore reproduced at a level above the too-loud threshold. In summary, the long section A has been attenuated to bring its level within the desired range between the two threshold values while section B has been detected as a short transient and has been allowed to pass through unattenuated.

In the preceding descriptions, sections A and B have been referred to as loud sections although they could of course, equally be quiet sections that would have been reproduced below the too-quiet threshold. In this case, the volume control data would produce a multiplying factor of greater than unity, for example, one and a half.

The precise values for the multiplying factors applied to the multiplier 55 may be determined empirically and may well depend on the setting of the too loud and too quiet thresholds. More than two thresholds may be applied so that sounds which were marginally too loud would be reduced by less than those which were extremely loud. The number of thresholds is arbitrary but clearly the greater the number of thresholds the more complex the amplitude analyzer 52 would have to be.

The description with reference to FIGS. 5 and 6 envisages a delay of a few seconds. Such a delay would normally be realized using a long shift register. However, in the arrangement described with reference to FIGS. 5 and 6, the amplitude analyzer 52 has to be able to change data which is already inside the shift register. Consequently what is required is a shift register function which allows random access addressing.

Figure 7:
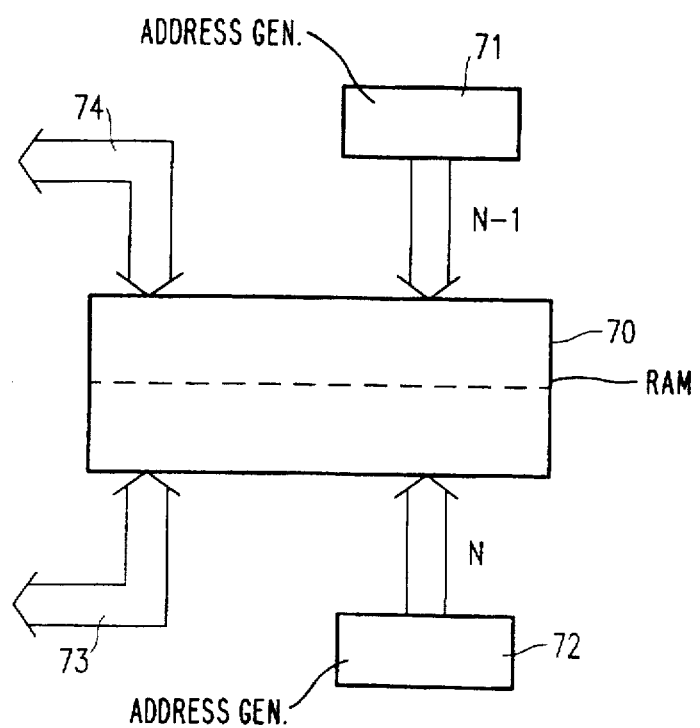
FIG. 7 shows a second embodiment of the AGC circuit of FIG. 4.

FIG. 7 illustrates how this can be achieved using a RAM. The RAM 70 is accessed with two address generators 71 and 72. The first address generator 71 is for writing the data to the RAM 70 while the second address generator 72 is for reading the data from the RAM. The audio samples are fed to the RAM 70 over a bus 73, which is also connected to the first input of the multiplier 45, so that audio samples can be written into the delay RAM 70 under the control of the write address generator 71 and read out from the delay RAM 70 and applied to the multiplier 55 under the control of the read address generator 72. Similarly, the volume control data from the amplitude analyzer 52 is fed over the bus 74 to the volume control delay RAM and written into the RAM 70 under the control of the write address generator 71 and read out from the RAM 70 under the control of the read address generator 72 and fed over the bus 74 to the second input of the multiplier 55.

As shown in FIG. 7, the read address generator accesses byte N when the write address generator accesses byte N-1. The address generators are incremented by one for each audio sample and the all 1's address is followed by the all 0's address. In this way, the data written to address N-1 will not be read until a time t equal to the RAM length multiplied by the number of samples per second later. Since the delay is being realized by a RAM, the amplitude analyzer 52 can write a volume flag at the beginning of the current section simply by adding an offset to the write address. The offset is the value contained in the amplitude analyzer's internal counter.

The threshold levels for too loud and too soft could be preset by the manufacturer but alternatively could be set by the listener using an additional control knob. The too loud and too quiet thresholds may be determined as a set proportion of the setting of a normal volume control knob but may be independent of the volume control setting if desired. Thus a fixed normal dynamic range may be specified by means of the too-loud and too-quiet thresholds, the transients of course exceeding those thresholds, while the average overall listening level may be determined by a normal volume control which acts on an analog amplifier after the thresholding has taken place. Alternatively, the degree of compression could be dependent on the setting of the volume control, thus raising the too-quiet threshold as a proportion of the overall signal range when the volume control is set to a relatively low value, and lowering the too-loud threshold as a proportion of the overall signal range when the volume control is set to a relatively high setting.

The invention allows a high quality music source to be listened to in a relatively noisy environment, such as a car, without the need for constant manual control changes. Sources, such as compact disc or digital compact cassette, have such a high dynamic range that the quiet sections are often too quiet to be heard above the background noise within a car. If, however the volume is turned up to accommodate these quiet sections, the loud sections are too loud. A straight forward approach such as compression compromises the music. The invention, however, allows the transients to pass through so that the dynamic range perceived by the listener is much greater than that achieved with a straight forward compression of the musical range.

From reading the present disclosure, other variations and modifications will be apparent to persons skilled in the art. Such variations and modifications may involve equivalent and other features which are already known in the design and use of audio signal reproduction apparatus and component parts thereof and which may be used instead of or in addition to features already described herein. Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during the prosecution of the present Application or of any further Application derived therefrom.

I claim:

1. Audio signal reproduction apparatus comprising:

input means for receiving an input audio signal;

amplifying means having an input coupled to said input means, and a control input for receiving a control signal for controlling a gain of said amplifying means;

monitoring means having an input coupled to said input means, said monitoring means monitoring an amplitude of the input audio signal;

gain control means having an input coupled to an output of said monitoring means, and an output coupled to the control input of said amplifying means, said gain control means generating said control signal for controlling the gain of the amplifying means in response to the amplitude of the input audio signal; and output means coupled to an output of said amplifying means for supplying an output audio signal, wherein the monitoring means determines whether, at any given time, a value of the input audio signal amplitude exceeds a first reset value, whether said input signal amplitude value is below a second preset value which is less than said first preset value, or whether input signal amplitude value lies between the first and second preset values, and the gain control means is responsive to the monitoring means to cause the gain of the amplifying means to be set to a first value if the input audio signal amplitude value exceeds the first preset value for at least a given time period, to be set to a second value if the input audio signal amplitude value is between the two preset values for at least the given time period, and to be set to a third value if the audio input signal amplitude value is below the second preset value for at least the given time period.

2. Apparatus as claimed in claim 1, wherein the input audio signal is in digital form, and wherein the monitoring means comprises a digital comparator providing a first output control signal when the input audio signal amplitude level is above the first preset value, a second output control signal when the input audio signal amplitude level is between the first and second preset values, and a third output control signal when the input audio signal amplitude level is below the second preset value.

3. Apparatus as claimed in claim 2, wherein said amplifying means and said gain control means comprise a multiplier circuit having a first input to which the input audio signal is applied, and a second input to which the first, second, and third output control signals are applied, an output of the multiplier being coupled to audio output means.

4. Apparatus as claimed in claim 1, wherein the given time period lies between one and five seconds.

5. Apparatus as claimed in claim 1, wherein, for a quiet passage in said input audio signal which persists for at least the given time period, the gain control means sets the gain of the amplifying means to the third value at the start of the quiet passage.

6. Apparatus as claimed in claim 1, wherein there are more than two preset values and a corresponding number of different gain factors.

* * * * *